(12) United States Patent
Zang et al.

(10) Patent No.: US 9,564,484 B2
(45) Date of Patent: Feb. 7, 2017

(54) METAL-INSULATOR-METAL BACK END OF LINE CAPACITOR STRUCTURES

(71) Applicant: GLOBALFOUNDRIES INC., Grand Cayman (KY)

(72) Inventors: Hui Zang, Guilderland, NY (US); Bingwu Liu, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/983,157

(22) Filed: Dec. 29, 2015

(65) Prior Publication Data

US 2016/0118458 A1    Apr. 28, 2016

Related U.S. Application Data

(62) Division of application No. 14/271,515, filed on May 7, 2014, now Pat. No. 9,252,203.

(51) Int. Cl.
| | |
|---|---|
| *H01L 21/02* | (2006.01) |
| *H01L 49/02* | (2006.01) |
| *H01L 23/522* | (2006.01) |
| *H01L 23/532* | (2006.01) |

(52) U.S. Cl.
CPC ........... *H01L 28/60* (2013.01); *H01L 23/5223* (2013.01); *H01L 23/5226* (2013.01); *H01L 23/53228* (2013.01); *H01L 23/53295* (2013.01); *H01L 2924/0002* (2013.01)

(58) Field of Classification Search
CPC ...... H01L 27/0805; H01L 28/40; H01L 28/60; H01L 23/5223; H01L 23/5226; H01L 29/92
USPC ......................................................... 257/532
See application file for complete search history.

(56) References Cited

U.S. PATENT DOCUMENTS

| | | | | |
|---|---|---|---|---|
| 2004/0046197 | A1* | 3/2004 | Basceri ............... | H01L 21/3141 257/296 |
| 2005/0130369 | A1* | 6/2005 | Kim .................... | H01L 23/5223 438/250 |
| 2009/0200638 | A1* | 8/2009 | Smith ................ | H01L 21/76816 257/532 |
| 2010/0219502 | A1* | 9/2010 | Shieh .................. | H01L 23/5223 257/532 |
| 2013/0130465 | A1* | 5/2013 | Choi ................. | H01L 27/10852 438/381 |
| 2014/0319653 | A1* | 10/2014 | Fornara ............... | H01L 23/5223 257/532 |

* cited by examiner

*Primary Examiner* — Tu-Tu Ho
(74) *Attorney, Agent, or Firm* — Williams Morgan, P.C.

(57) ABSTRACT

Embodiments of the present invention provide improved metal-insulator-metal (MIM) capacitors. In embodiments, series resistance is reduced by forming a via underneath the bottom plate of a MIM capacitor, leading to a metallization layer or intermediate metal sublayer. In embodiments, the MIM capacitor is formed with a corrugated shape to increase the plate surface area, allowing a thicker dielectric to be used, thereby mitigating leakage issues.

8 Claims, 5 Drawing Sheets

METAL-INSULATOR-METAL BACK END OF LINE CAPACITOR STRUCTURES

CROSS-REFERENCE TO RELATED APPLICATIONS

This application is a divisional of co-pending application Ser. No. 14/271,515 filed May 7, 2014.

FIELD OF THE INVENTION

The present invention relates generally to semiconductor integrated circuits, and more particularly, to metal-insulator-metal capacitor structures.

BACKGROUND

With the current trends in integrated circuit miniaturization, and increasingly smaller critical dimensions, it is desirable in semiconductor device technology to integrate many different functions on a single chip (e.g., having both analog and digital circuitry on the same die). Metal-insulator-metal (MIM) capacitors are well suited for use in these integrated circuits. A MIM capacitor is a particular type of capacitor having two metal plates disposed around a capacitor dielectric. They are rather large in size, being several hundred micrometers wide (i.e., depending on the capacitance, which is much larger than a transistor or memory cell, for example). MIM capacitors are typically used as decoupling capacitors for microprocessors, radio-frequency (RF) capacitors in high frequency circuits, and filter and analog capacitors in mixed-signal products, for example. As MIM capacitors are playing an important role in implementation of new integrated circuit designs, it is desirable to have improvements in MIM capacitors.

SUMMARY

Embodiments of the present invention provide improved metal-insulator-metal (MIM) capacitors. In embodiments, series resistance is reduced by forming a via underneath the bottom plate of a MIM capacitor, leading to a metallization layer or intermediate metal sublayer. In embodiments, the MIM capacitor is formed with a corrugated shape to increase the plate surface area, allowing a thicker dielectric to be used, thereby mitigating leakage issues.

In a first aspect, embodiments of the present invention provide a semiconductor structure comprising: a first metallization layer; an interlevel dielectric layer disposed on the first metallization layer; a second metallization layer disposed on the interlevel dielectric layer; a metal-insulator-metal (MIM) capacitor disposed within the interlevel dielectric layer, the MIM capacitor having a first plate, a capacitor dielectric layer, and a second plate, wherein the capacitor dielectric layer is disposed between the first plate and the second plate; a via from the second plate to a metal region within the first metallization layer; a via from the first plate to the second metallization layer; and a via from the metal region to the second metallization layer.

In a second aspect, embodiments of the present invention provide a semiconductor structure comprising: a first metallization layer; an interlevel dielectric layer disposed on the first metallization layer; a metal sublayer disposed within the interlevel dielectric layer; a second metallization layer disposed on the interlevel dielectric layer; a metal-insulator-metal (MIM) capacitor disposed on the metal sublayer, the MIM capacitor having a first plate, a capacitor dielectric layer, and a second plate, wherein the capacitor dielectric layer is disposed between the first plate and the second plate, and wherein a portion of the metal sublayer extends beyond the MIM capacitor, and wherein the first plate is in contact with the metal sublayer; a via from the first plate to the second metallization layer; and a via from the metal sublayer to the second metallization layer.

In a third aspect, embodiments of the present invention provide a semiconductor structure comprising: a first metallization layer; an interlevel dielectric layer disposed on the first metallization layer; a metal sublayer disposed within the interlevel dielectric layer; a second metallization layer disposed on the interlevel dielectric layer; a metal-insulator-metal (MIM) capacitor disposed on the metal sublayer, the MIM capacitor having a first plate, a capacitor dielectric layer, and a second plate, wherein the capacitor dielectric layer is disposed between the first plate and the second plate, and wherein a portion of the metal sublayer extends beyond the MIM capacitor, wherein the first plate is in contact with the metal sublayer, and wherein the MIM capacitor comprises a corrugated shape; a via from the first plate to the second metallization layer; and a via from the metal sublayer to the second metallization layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
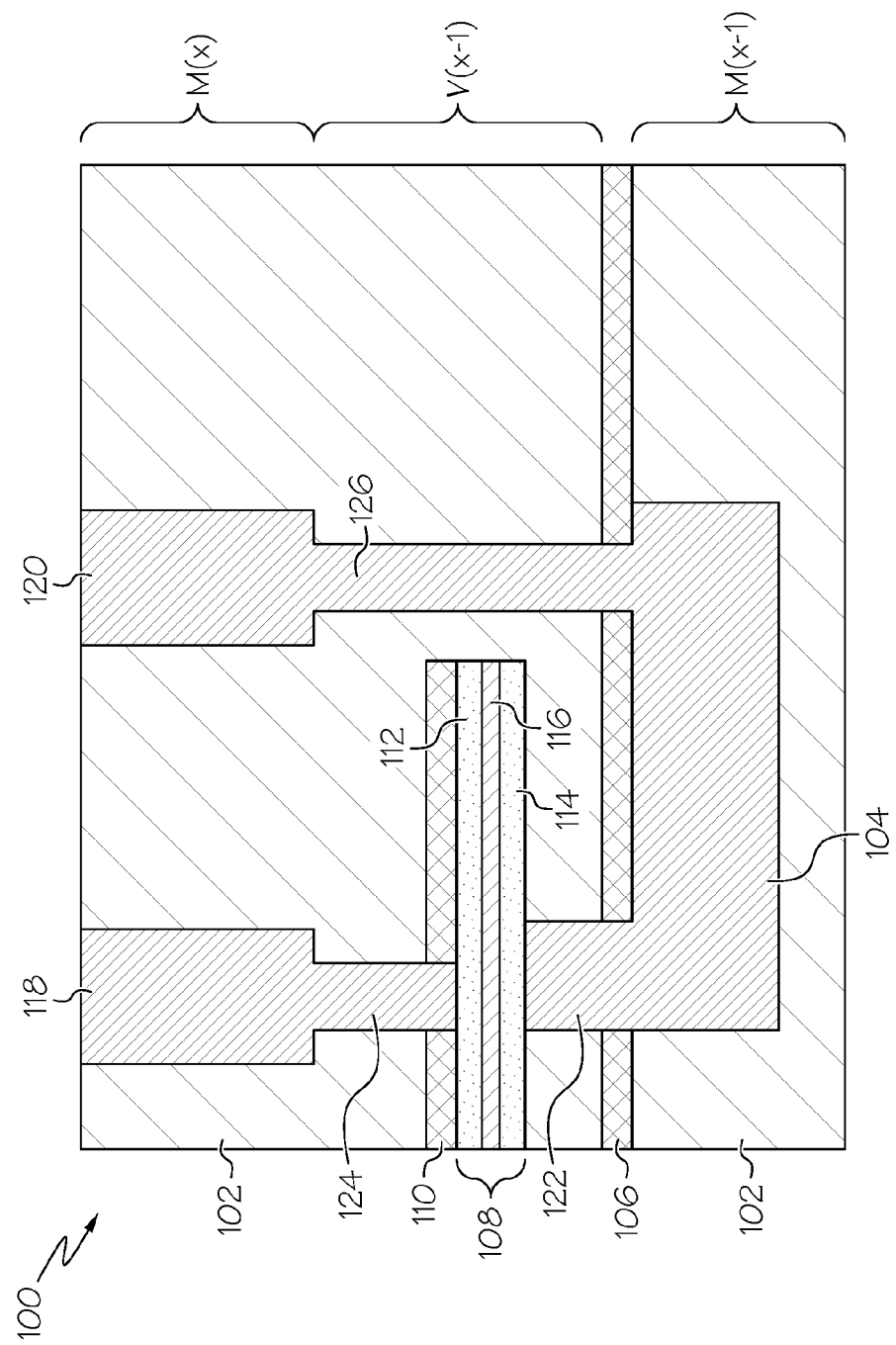

In some cases, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a semiconductor structure in accordance with embodiments of the present invention.

Figure 2:
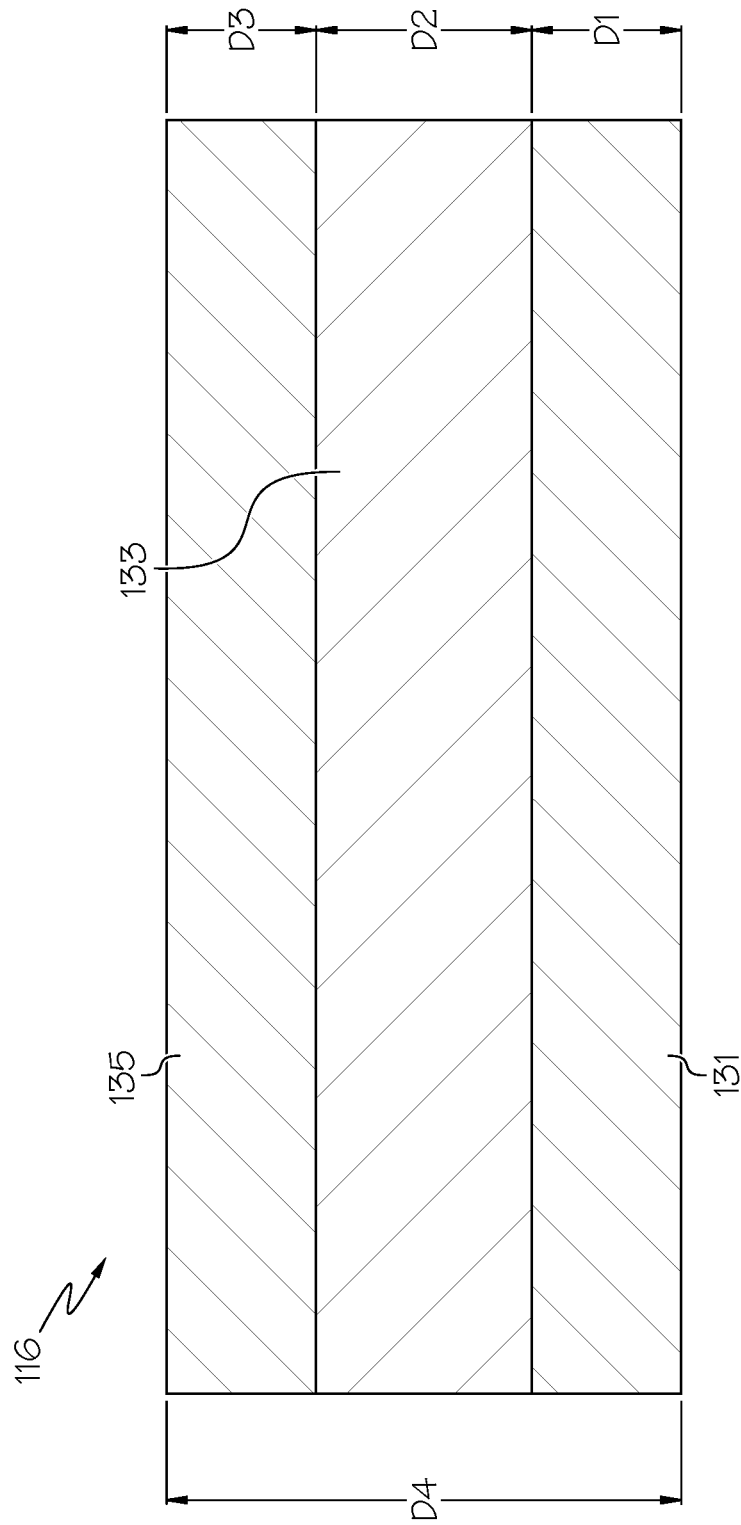

FIG. 2 is a detailed view of a capacitor dielectric layer in accordance with embodiments of the present invention.

Figure 3:
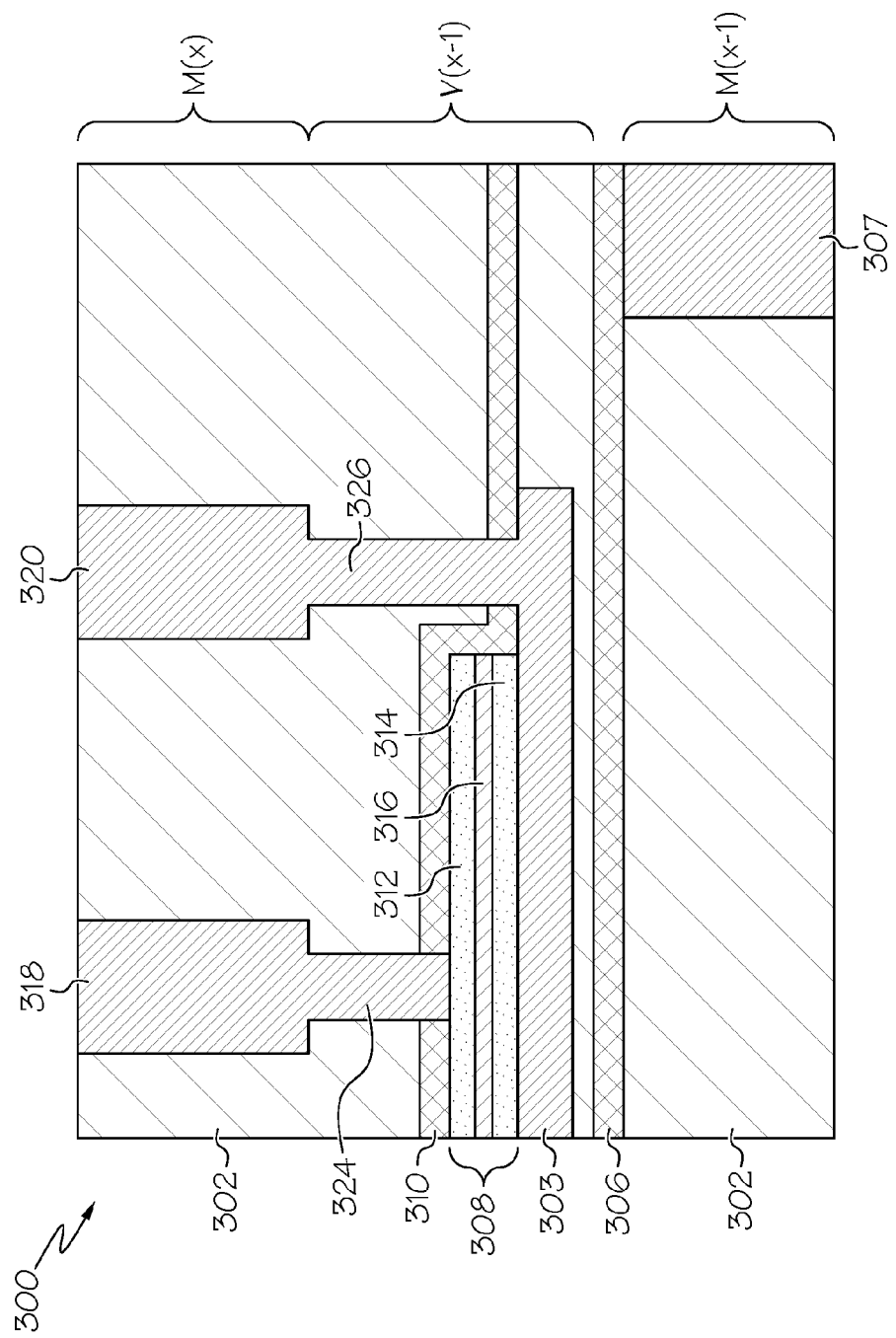

FIG. 3 is a semiconductor structure in accordance with additional embodiments of the present invention.

Figure 4:
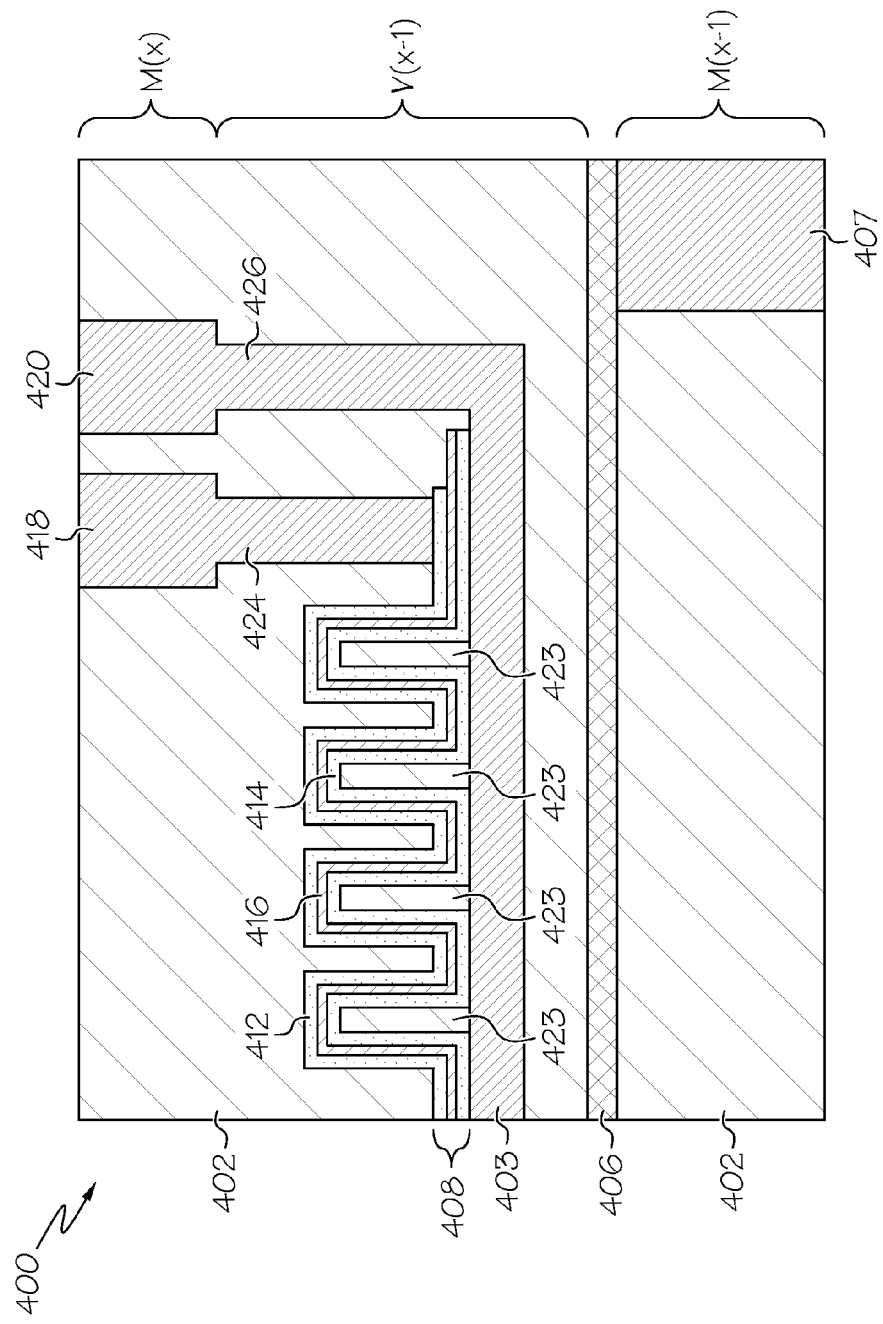

FIG. 4 is a semiconductor structure in accordance with additional embodiments of the present invention.

Figure 5:
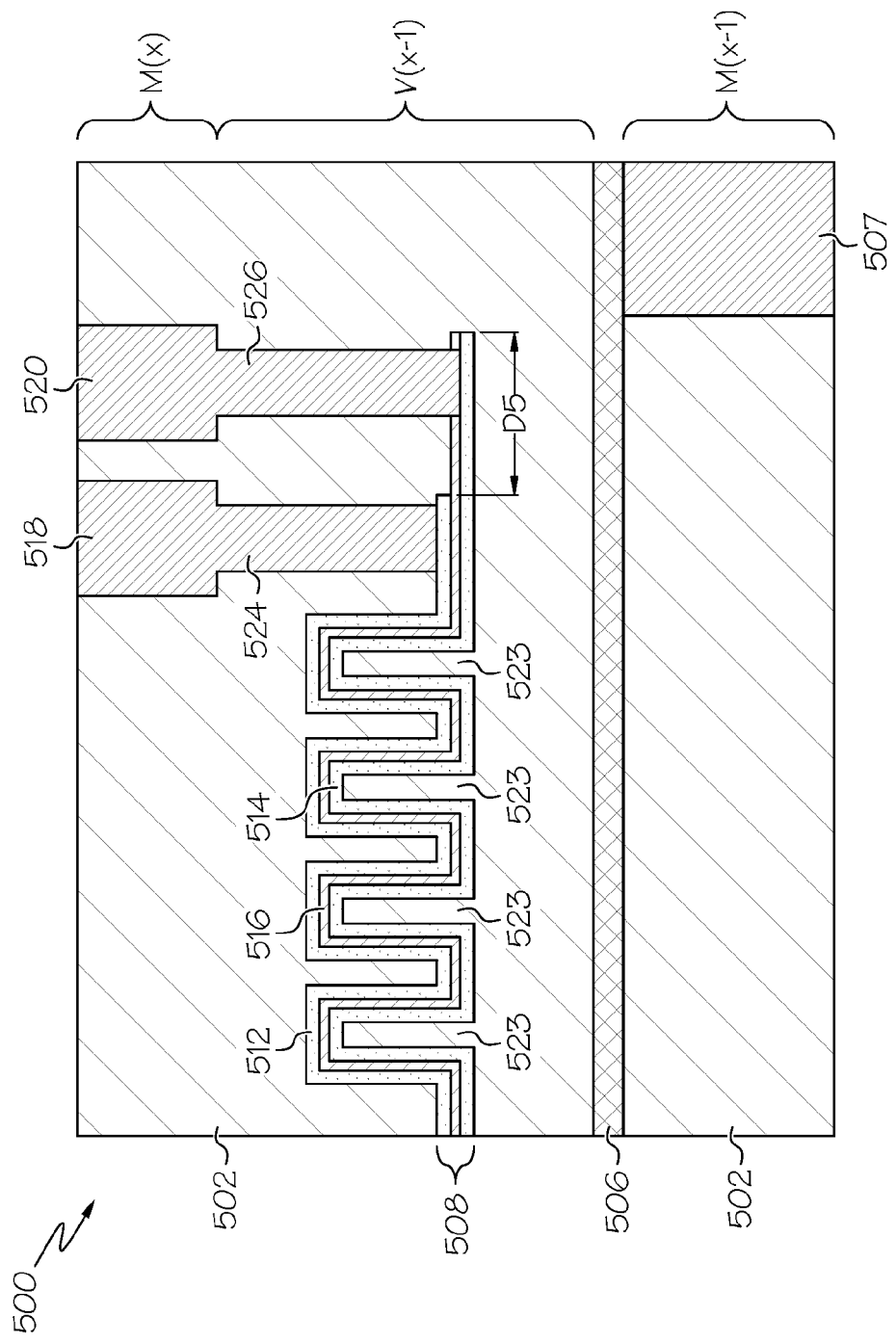

FIG. 5 is a semiconductor structure in accordance with additional embodiments of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or ore other features, regions, integers, steps, operations, elements, components, and/or groups thereof.

Reference throughout this specification to "one embodiment," "an embodiment," "embodiments" "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1 is a semiconductor structure 100 in accordance with embodiments of the present invention. Semiconductor structure 100 includes a plurality of back end of line (BEOL) layers. These layers include a first metallization layer M(x−1), a via layer V(x−1), and a second metallization layer M(x). An interlevel dielectric (ILD) layer 102 is used to contain the various metallization and via layers. In embodiments, the interlevel dielectric layer 102 may be comprised of an oxide, such as silicon oxide (SiO2), tetraethoxysilane (TEOS) oxide, or other suitable material. While two metallization layers are shown in FIG. 1, in practice, there can be many more metallization and via layers. Disposed between the two metallization layers M(x−1) and M(x), is a MIM capacitor 108. The MIM capacitor 108 comprises a first plate 112 and a second plate 114. Disposed between first plate 112 and second plate 114 is capacitor dielectric layer 116. In embodiments, the first plate 112 and second plate 114 may be comprised of titanium nitride (TiN), boron-doped titanium nitride (TiBN), or of tantalum nitride (TaN). Other materials may also be used. In embodiments, dielectric layer 116 may comprise hafnium oxide and/or aluminum oxide.

A bottom via 122 provides an electrical connection between bottom plate 114 and metallization region 104. Metallization region 104 is part of the M(x−1) metallization layer. A barrier layer 106 is disposed above the metallization region 104. In embodiments, the barrier layer 106 may include silicon nitride. A similar barrier layer 110 may be formed on the (first) top plate 112 of the MIM capacitor 108. A top via 124 provides an electrical connection between top plate 112 and metallization region 118. Metallization region 118 is part of the M(x) metallization layer. Via 126 provides an electrical connection between (second) bottom plate 112 (by way of metal region 104) and metallization region 120. Metallization region 120 is part of the M(x) metallization layer. Hence, metallization regions 118 and 120 serve as the two terminals of MIM capacitor 108. The vias 124 and 122 that are substantially perpendicular to the respective capacitor plates 112 and 114 serve to reduce the resistance of the MIM capacitor, thereby improving device performance. In embodiments, the metallization regions and vias are comprised of copper. One or more thin barrier layers (not shown), such as tantalum nitride, may be used to surround the via and metallization lines to prevent diffusion of copper.

FIG. 2 is a detailed view of a capacitor dielectric layer 116 in accordance with embodiments of the present invention. In embodiments, capacitor dielectric layer 116 may be comprised of three sublayers, shown as 131, 133, and 135. In embodiments, sublayers 131 and 135 may be comprised of hafnium oxide, while sublayer 133 is comprised of aluminum oxide, forming a HAH structure (Hf—Al—Hf). In other embodiments, sublayers 131 and 135 may be comprised of aluminum oxide, while sublayer 133 is comprised of hafnium oxide, forming a AHA structure (Al—Hf—Al). Sublayer 131 has a thickness D1. Sublayer 133 has a thickness D2. Sublayer 133 has a thickness D3. The total thickness of the capacitor dielectric layer 116 is D4, where D4=D1+D2+D3. In embodiments, D1, D2, and D3 may each range from about 1 nanometer to about 4 nanometers. Hence, in embodiments, the total thickness D4 of the capacitor dielectric layer 116 may range from about 3 nanometers to about 12 nanometers. A capacitor dielectric layer as shown in FIG. 2 may be used in any of the embodiments disclosed herein.

FIG. 3 is a semiconductor structure 300 in accordance with additional embodiments of the present invention. Semiconductor structure 300 includes a plurality of back end of line (BEOL) layers. These layers include a first metallization layer M(x−1), a via layer V(x−1), and a second metallization layer M(x). An interlevel dielectric layer 302 is used to contain the various metallization and via layers. In embodiments, the interlevel dielectric layer 302 may be comprised of an oxide, such as silicon oxide (SiO2), tetraethoxysilane (TEOS) oxide, or other suitable material. While two metallization layers are shown in FIG. 3, in practice, there can be many more metallization and via layers. Disposed between the two metallization layers M(x−1) and M(x), is a MIM capacitor 308. The MIM capacitor 308 comprises a first plate 312 and a second plate 314. Disposed between first plate 312 and second plate 314 is capacitor dielectric layer 316. In embodiments, the first plate 312 and second plate 314 may be comprised of titanium nitride (TiN), boron-doped titanium nitride (TiBN), or of tantalum nitride (TaN). Other materials may also be used. In embodiments, dielectric layer 316 may comprise hafnium oxide and/or aluminum oxide. A metal sublayer 303 is disposed within the interlevel dielectric layer 302 within via layer V(x−1). Metal sublayer 303 is in contact with second plate 314. A portion of the metal sublayer 303 extends beyond the MIM capacitor 308, and is connected to via 326 which connects to metal region 320 of metal layer M(x). A via 324 provides an electrical connection between first plate 312 and metallization region 318. A barrier layer 306 is disposed above the metallization region 307 which belongs to metallization layer M(x−1). In embodiments, the barrier layer 306 may include silicon nitride. A similar barrier layer 310 may be formed on the (first) top plate 312 of the MIM capacitor 308. The metal sublayer 303 has a relatively large contact area with bottom plate 314, and hence reduces contact resistance. In this embodiment, the metal sublayer 303 does not occupy any of the M(x−1) layer, which results in more M(x−1) layer available for other uses. However, additional etch and deposition steps are used to make the metal sublayer 303. Hence, there is a tradeoff between the embodiment of FIG. 1 and the embodiment of FIG. 3. If M(x−1) layer utilization is at a premium, the embodiment of FIG. 3 is well suited for this situation. If M(x−1) layer space is available, the embodiment of FIG. 1 provides reduced manufacturing complexity.

FIG. 4 is a semiconductor structure in accordance with additional embodiments of the present invention. Semiconductor structure 400 includes a plurality of back end of line (BEOL) layers. These layers include a first metallization layer M(x−1), a via layer V(x−1), and a second metallization layer M(x). An interlevel dielectric layer 402 is used to contain the various metallization and via layers. In embodiments, the interlevel dielectric layer 402 may be comprised of an oxide, such as silicon oxide (SiO2), tetraethoxysilane (TEOS) oxide, or other suitable material. While two metallization layers are shown in FIG. 4, in practice, there can be many more metallization and via layers. Disposed between the two metallization layers M(x−1) and M(x), is a MIM capacitor 408. The MIM capacitor 408 comprises a first plate 412 and a second plate 414. Disposed between first plate 412 and second plate 414 is capacitor dielectric layer 416. In embodiments, the first plate 412 and second plate 414 may be comprised of titanium nitride (TiN), boron-doped titanium nitride (TiBN), or of tantalum nitride (TaN). Other materials may also be used. In embodiments, dielectric layer 416 may comprise hafnium oxide and/or aluminum oxide. A metal sublayer 403 is disposed within the interlevel dielectric layer 402 within via layer V(x−1). Metal sublayer 403 is in contact with second plate 414 and serves to reduce contact resistance. A portion of the metal sublayer 403 extends beyond the MIM capacitor 408, and is connected to via 426 which connects to metal region 420 of metal layer M(x). A via 424 provides an electrical connection between first plate 412 and metallization region 418. A plurality of ILD regions 423 are formed spaced apart, and disposed on metal sublayer 403. The MIM capacitor 408 is formed by depositing the plate 414, capacitor dielectric layer 416, and plate 412 over the plurality of ILD regions, such that the MIM capacitor comprises a corrugated shape. The corrugated shape (combination of vertical and horizontal segments) increases the surface area of the plates, which increases the capacitance. This allows the use of a thicker dielectric layer 416. As such, the leakage of the corrugated MIM capacitor 408 is reduced, and the reliability is improved accordingly. A barrier layer 406 is disposed above the metallization region 407 which belongs to metallization layer M(x−1). In embodiments, the barrier layer 406 may include silicon nitride.

FIG. 5 is a semiconductor structure in accordance with additional embodiments of the present invention. Semiconductor structure 500 includes a plurality of back end of line (BEOL) layers. These layers include a first metallization layer M(x−1), a via layer V(x−1), and a second metallization layer M(x). An interlevel dielectric layer 502 is used to contain the various metallization and via layers. In embodiments, the interlevel dielectric layer 502 may be comprised of an oxide, such as silicon oxide (SiO2), tetraethoxysilane (TEOS) oxide, or other suitable material, such as a low K dielectric material (e.g., K<4). While two metallization layers are shown in FIG. 1, in practice, there can be many more metallization and via layers. Disposed between the two metallization layers M(x−1) and M(x), is a MIM capacitor 508. The MIM capacitor 508 comprises a first plate 512 and a second plate 514. Disposed between first plate 512 and second plate 514 is capacitor dielectric layer 516. In embodiments, the first plate 512 and second plate 514 may be comprised of titanium nitride (TiN), boron-doped titanium nitride (TiBN), or of tantalum nitride (TaN). Other materials may also be used. In embodiments, dielectric layer 516 may comprise hafnium oxide and/or aluminum oxide. In embodiments, the second (bottom) plate 514 may extend at a distance D5 beyond the first (top) plate 512. In embodiments, distance D5 may range from about 500 nanometers to about 2 micrometers. A barrier layer 506 is disposed above the metallization region 507 which belongs to metallization layer M(x−1). In embodiments, the barrier layer 506 may include silicon nitride. A via 524 provides an electrical connection between first plate 512 and metallization region 518. A via 526 provides an electrical connection between second plate 514 and metallization region 520. The MIM capacitor 508 is formed by depositing the plate 514, capacitor dielectric layer 516, and plate 512 over the plurality of ILD regions 523, such that the MIM capacitor comprises a corrugated shape. The corrugated shape (combination of vertical and horizontal segments) increases the surface area of the plates, which increases the capacitance. This allows the use of a thicker dielectric layer 516. As such, the leakage of the corrugated MIM capacitor 508 is reduced and the reliability is improved accordingly.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
    a first metallization layer;
    an interlevel dielectric layer disposed on the first metallization layer;
    a barrier layer disposed between the first metallization layer and the interlevel dielectric layer;
    a second metallization layer disposed on the interlevel dielectric layer;
    a metal-insulator-metal (MIM) capacitor disposed within the interlevel dielectric layer, the MIM capacitor having a first plate, a capacitor dielectric layer, and a second plate, wherein the capacitor dielectric layer is disposed between the first plate and the second plate;
    a via from the second plate to a metal region within the first metallization layer;
    a via from the first plate to the second metallization layer; and
    a via from the metal region to the second metallization layer.

2. The semiconductor structure of claim 1, wherein the metal region within the first metallization layer is comprised of copper.

3. The semiconductor structure of claim 1, wherein the first plate and second plate are comprised of titanium nitride.

4. The semiconductor structure of claim 1, wherein the first plate and second plate are comprised of boron-doped titanium nitride.

5. The semiconductor structure of claim 1, wherein the first plate and second plate are comprised of tantalum nitride.

6. The semiconductor structure of claim 1, wherein the capacitor dielectric layer comprises hafnium oxide.

7. The semiconductor structure of claim 1, wherein the capacitor dielectric layer comprises aluminum oxide.

8. The semiconductor structure of claim 1, wherein the capacitor dielectric layer comprises tantalum oxide.

\* \* \* \* \*